(12) United States Patent
Hikida

(10) Patent No.: US 7,842,575 B2
(45) Date of Patent: Nov. 30, 2010

(54) VERTICAL MOS TRANSISTOR DEVICE WITH ASYMMETRICAL SOURCE AND DRAIN AND ITS MANUFACTURING METHOD

(75) Inventor: Satoshi Hikida, Nara (JP)

(73) Assignee: Sharp Kabushiki Kaisha, Osaka-shi, Osaka (JP)

(*) Notice: Subject to any disclaimer, the term of this patent is extended or adjusted under 35 U.S.C. 154(b) by 118 days.

(21) Appl. No.: 12/262,503

(22) Filed: Oct. 31, 2008

(65) Prior Publication Data

US 2009/0121263 A1 May 14, 2009

(30) Foreign Application Priority Data

Nov. 1, 2007  (JP)  ............... 2007-284723

(51) Int. Cl.
*H01L 21/336* (2006.01)
(52) U.S. Cl. ............... 438/270; 438/589; 257/E21.419
(58) Field of Classification Search ............... 438/270, 438/275, 425, 426, 589; 257/E21.419, E21.428
See application file for complete search history.

(56) References Cited

U.S. PATENT DOCUMENTS

| 6,215,150 | B1 | 4/2001 | Degawa |
| 6,686,624 | B2 * | 2/2004 | Hsu ............... 257/315 |
| 2001/0020720 | A1 | 9/2001 | Hueting et al. |
| 2003/0124804 | A1 | 7/2003 | Soo |

FOREIGN PATENT DOCUMENTS

| JP | 1-268172 A | 10/1989 |
| JP | 2-15476 A | 1/1990 |
| JP | 5-021790 A | 1/1993 |
| JP | 5-121748 A | 5/1993 |
| JP | 9-129873 A | 5/1997 |
| JP | 10-290007 A | 10/1998 |
| JP | 2003-526948 A | 9/2003 |
| JP | 2003-289142 A | 10/2003 |

* cited by examiner

*Primary Examiner*—Evan Pert
*Assistant Examiner*—W. Wendy Kuo
(74) *Attorney, Agent, or Firm*—Nixon & Vanderhye, P.C.

(57) ABSTRACT

A semiconductor device comprises a first conductive film formed downward, perpendicular to a substrate, penetrating through a first insulating film, a second conductive film formed downward along an outer wall of a second insulating film, a third insulating film formed from the bottom of the second conductive film to the top of the substrate in an area sandwiched between the first and second insulating films, contacting with at least the bottom of the second conductive film and an outer wall on a side which does not contact with the second insulating film, and a first impurity diffusion area of a first conductivity type, a second impurity diffusion area of a second conductivity type, a third impurity diffusion area of the first conductivity type and a fourth impurity diffusion area of the first conductivity type in a high concentration layered within the area sandwiched between the first and third insulating films.

8 Claims, 6 Drawing Sheets

Implantation of P-type Ions

Implantation of N-type Ions

Oxidization

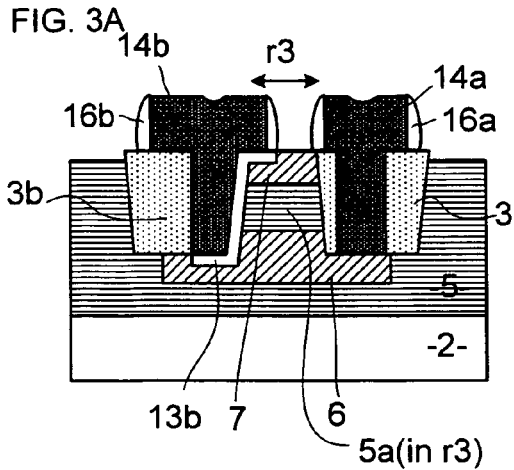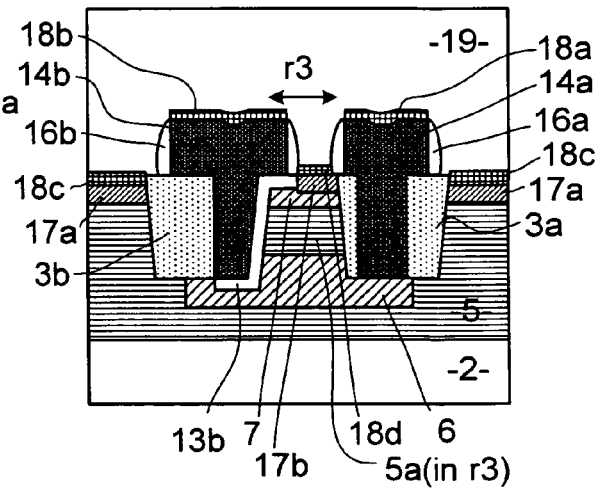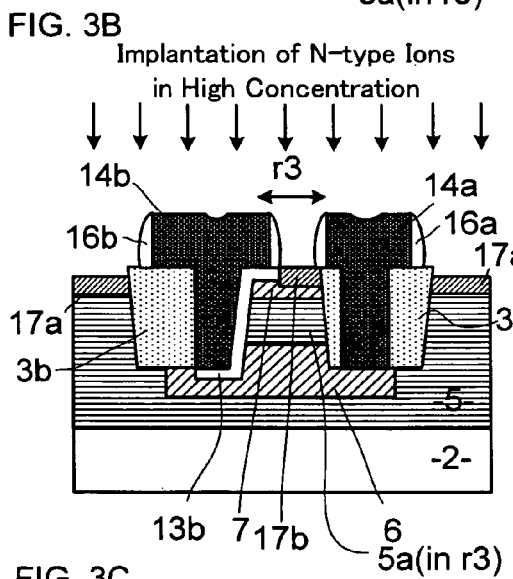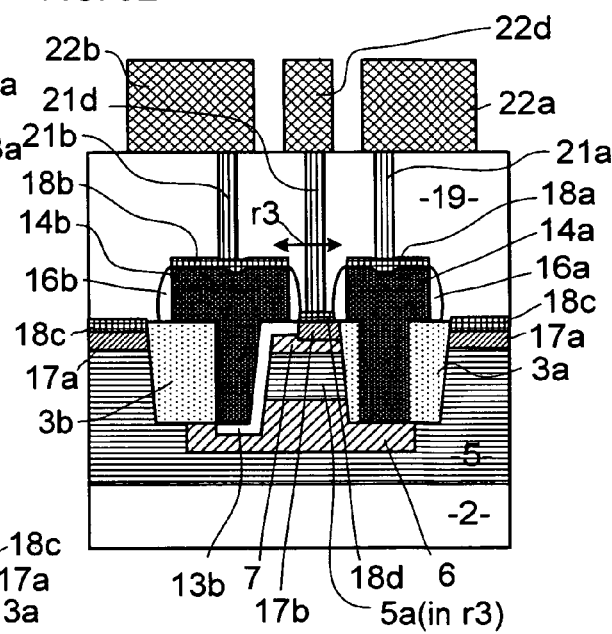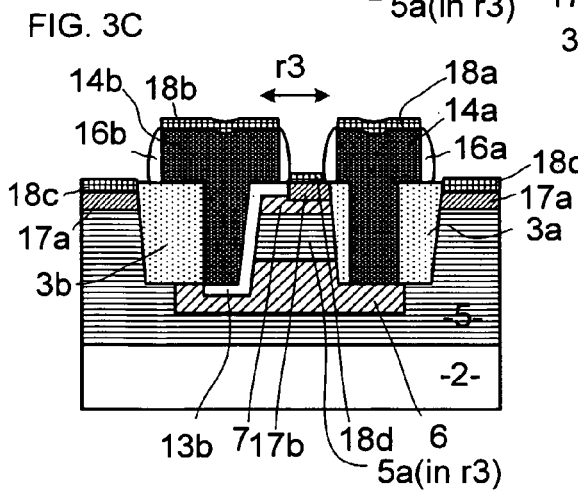

VERTICAL MOS TRANSISTOR DEVICE WITH ASYMMETRICAL SOURCE AND DRAIN AND ITS MANUFACTURING METHOD

CROSS REFERENCE TO RELATED APPLICATION

This Nonprovisional application claims priority under 35 U.S.C. §119(a) on Patent Application No. 2007-284723 filed in Japan on Nov. 1, 2007, the entire contents of which are hereby incorporated by reference.

BACKGROUND OF THE INVENTION

1. Field of the Invention

The technology described herein relates to a semiconductor device and its manufacturing method, and in particular, to a semiconductor device which includes a high voltage transistor and its manufacturing method.

2. Description of the Related Art

Semiconductor devices to which a high voltage is applied, such as nonvolatile memories, logic circuits mixed with nonvolatile memories and drive circuits in output stages for liquid crystal driver ICs require a high withstand voltage and a low on-resistance. Therefore, transistor elements provided in such semiconductor devices also require a high withstand voltage, and so far, various types of high voltage transistors have been developed. In particular, high voltage transistors require a long gate length for securing a withstand voltage against punch through and a low concentration impurity diffusion areas as a drift (electrical field buffering) area, and thus, the size naturally becomes much greater than that of low voltage transistors. Various technologies for reducing the scale of high withstand voltage transistor devices have been proposed and exist as the prior art (see for example Japanese Unexamined Patent Publication No. H2 (1990)-15476 (hereinafter referred to as well-known Document 1)).

FIG. 6 is a schematic cross sectional diagram showing the structure of the high voltage transistor element disclosed in well-known Document 1. In accordance with the manufacturing steps for this high voltage transistor element, first an element isolation insulating film 106 is formed in a predetermined area on an N-type semiconductor substrate 101, and a trench 109 having a predetermined length and depth is created. Next, a gate oxide film 107 and a gate electrode 105 are grown along the inner wall of the trench 109 and etched so as to have predetermined gate dimensions, and after that, a source diffusion area 102 and a drain diffusion area 103 are formed through ion implantation of a P-type high concentration impurity, and furthermore, an electrical field buffering area (pinch resistance layer) 104 is formed on the inner wall of the trench 109 on the drain 103 side through ion implantation of a P-type low concentration impurity. The electrical field buffering area 104 is formed along the inner wall of the trench 109 on the drain diffusion area 103 side.

By providing the configuration shown in FIG. 6, the gate electrode 105 and the electrical field buffering area 104 can be formed on the left and right side walls, respectively, of the trench 109 in the semiconductor substrate 1. As a result, both the length of the source diffusion area 102 and that of the drain diffusion area 104 can be reduced, and thus, the scale of the semiconductor device can be prevented from increasing as a whole, to a certain degree.

In the case of the method described in well-known Document 1, however, it is necessary to process the gate electrode 105 in such a state that the gate electrode has a step, and therefore, high-precision processing is difficult, and there is a possibility that the yield may become lower. In addition, it is also extremely difficult to make a contact connection to the gate electrode 105 having a step, and therefore, the process cannot be said to be realistic.

Furthermore, in the structure in FIG. 6, the channel area is formed in a location lower than the element isolation insulating film 106 on the semiconductor substrate 101, and therefore, the electrical field buffering effects at the ends of the channel area become very small, and thus, the possibility of the withstand voltage lowering and a leak pass being created becomes extremely high.

SUMMARY OF THE INVENTION

The technology described herein is provided in view of the above described problem, and an object of the technology described herein is to provide a semiconductor device in which a high withstand voltage can be maintained while keeping any increase in the scale of the device to the minimum, and which is easy to manufacture in a realistic manufacturing process.

In order to achieve the above described object, a semiconductor device according to the technology described herein is firstly characterized by comprising: a first insulating film and a second insulating film formed on a semiconductor substrate downward from a surface of the semiconductor substrate so as to be at a distance from each other in a direction parallel to the surface of the semiconductor substrate; a first conductive film formed in a direction of a depth, which is perpendicular to the surface of the semiconductor substrate, so as to penetrate through the first insulating film from a top to a bottom of the first insulating film; a second conductive film formed along an outer wall of the second insulating film on a side facing the first insulating film in the direction of the depth from a top to a bottom of the second insulating film; a third insulating film formed in an area from a point at the same level as the bottom of the second conductive film to an upper surface of the semiconductor substrate in a first area sandwiched between the first and second insulating films so as to make contact with at least the bottom of the second conductive film and the outer wall of the second conductive film on the side facing the first insulating film; a first impurity diffusion area of a first conductivity type, a second impurity diffusion area of a second conductivity type which is different from the first conductivity type, a third impurity diffusion area of the first conductivity type, and a fourth impurity diffusion area of the first conductivity type of which concentration is higher than in the third impurity diffusion area, which are formed in this order from a deeper point than the bottom of the first insulating film toward the upper surface of the semiconductor substrate in an area sandwiched between the third insulating film and the first insulating film; and an interlayer insulating film formed above the semiconductor substrate, wherein the first impurity diffusion area makes contact with a bottom of the first conductive film and faces the second conductive film across the third insulating film without making contact with the second conductive film, the second impurity diffusion area and the third impurity diffusion area make contact with an outer wall of the first insulating film and face the second conductive film across the third insulating film without making contact with the second conductive film, and contact plugs for making electrical contact with the first conductive film, the second conductive film and the fourth impurity diffusion area respectively are formed so as to penetrate through the interlayer insulating film.

In the above described configuration for the semiconductor device according to the first characteristics of the technology described herein, the third impurity diffusion area of a low concentration which functions as an electrical field buffering area is formed adjacent to the fourth impurity diffusion area of a high concentration which functions as a source diffusion area in the direction of the depth, which is perpendicular to the surface of the semiconductor substrate. As a result, the withstand voltage of the semiconductor device can be increased while the area occupied by the semiconductor device is prevented from increasing in the direction parallel to the surface of the semiconductor substrate.

In addition, in the configuration of the device according to the technology described herein, the first conductive film and the second conductive film are both formed in the direction of the depth, which is perpendicular to the surface of the semiconductor substrate, and therefore, manufacturing in accordance with a conventional processing method is possible, unlike in conventional structures, which require processing of an electrode in such a state that the electrode has a step during the manufacturing step. Accordingly, it becomes possible to maintain a high yield.

More concretely, in the configuration of the above described semiconductor device according to the first characteristics of the technology described herein, a MOS transistor can be implemented so as to be provided with a gate electrode formed of the second conductive film, a gate oxide film formed of the third insulating film, a drain diffusion area formed of the first impurity diffusion area, a source diffusion area formed of the third and fourth impurity diffusion areas, and a channel area formed of the second impurity diffusion area. In this configuration, a MOS transistor having excellent performance in terms of withstanding high voltages can be implemented while the area occupied by the MOS transistor is prevented from increasing in the direction parallel to the surface of the semiconductor substrate. In addition, the second impurity diffusion area which functions as a channel area is formed within an area (first area) sandwiched between the first and second insulating films. Therefore, excellent electrical buffering effects can be gained at the ends of the channel area in comparison with conventional configurations, where the channel area is formed at a point lower than the element isolation insulating film, and thus, a MOS transistor having excellent performance in terms of withstanding high voltages can be implemented.

In addition to the above described first characteristics, the semiconductor device according to the technology described herein is secondly characterized in that silicide layers are formed on the first conductive film, the second conductive film and the fourth impurity diffusion area, respectively, and the contact plugs make contact with the respective silicide layers.

In the configuration of the semiconductor device according to the above described second characteristics of the technology described herein, contact resistance between the contact plug and the first conductive film, between the contact plug and the second conductive film, and between the contact plug and the fourth impurity diffusion area can be reduced.

In addition to the above described first or second characteristics, the semiconductor device according to the technology described herein is thirdly characterized in that the first conductive film and the second conductive film are doped polysilicon films of the first conductivity type.

In the configuration of the semiconductor device according to the above described third characteristics of the technology described herein, resistance of the first and second conductive films can be lowered.

In addition, a manufacturing method for a semiconductor device according to the technology described herein is a manufacturing method for a semiconductor device according to any of the above described first to third characteristics, and is firstly characterized by comprising steps of; forming the first insulating film and the second insulating film downward from the surface of the semiconductor substrate so that the first and second insulating films are at a distance from each other in a direction parallel to the surface of the semiconductor substrate; forming the second impurity diffusion area in the first area sandwiched between at least the first and second insulating films after the first and second insulating films forming step; forming the first impurity diffusion area and the third impurity diffusion area, respectively, by implanting low concentration ions of the first conductivity type a plurality of times with different conditions for the implantation after the second impurity diffusion area forming step, the first impurity diffusion area being formed from a point which is deeper than bottoms of the first and second insulating films to a point which is shallower than the bottoms but deeper than an upper surface of the semiconductor substrate so as to make contact with at least the bottoms of the first and second insulating films and portions of outer walls of the first and second insulating films facing each other within the first area, and the third impurity diffusion area being formed so as to face the first impurity diffusion area across the second impurity diffusion area and make contact with portions of the outer walls of the first and second insulating films facing each other within the first area; forming a first trench and a second trench, respectively, by carrying out an etching process on the first and second insulating films in such a state that predetermined areas are masked after the first and third impurity diffusion areas forming step, the first trench having a bottom composed of the first impurity diffusion area and an inner wall surrounded by the first insulating film, the second trench having a bottom composed of the first impurity diffusion area and an inner wall of which a portion is made of the second insulating film and the remaining portion is made of a multilayer structure of the first impurity diffusion area, the second impurity diffusion area and the third impurity diffusion area; forming the third insulating film by carrying out an oxidation process after the first and second trenches forming step, the third insulating film extending from at least the bottom of the second trench to the upper surface of the semiconductor substrate within the first area via the multilayer structure which forms a part of the inner wall of the second trench; forming the first conductive film for filling in the first trench and the second conductive film for filling in the second trench by forming a conductive material film over an entire surface so that the first and second trenches are completely filled in after the third insulating film forming step, and by dividing the conductive material film at a point above an area sandwiched between the first and second trenches; exposing the third impurity diffusion area by removing the third insulating film formed within an area sandwiched between the first and second conductive films after the first and second conductive films forming step; forming a fourth impurity diffusion area on the third impurity diffusion area by implanting impurity ions of the first conductivity type in a high concentration after the third impurity diffusion area exposing step; forming an interlayer insulating film over an entire surface after the fourth impurity diffusion area forming step; and forming the contact plugs for making electrical contact with the first conductive film, the second conductive film and the fourth impurity diffusion area, respectively after the interlayer insulating film forming step.

In accordance with the manufacturing method for a semiconductor device according to the above described first characteristics of the technology described herein, the third impurity diffusion area of a low concentration which functions as an electrical field buffering area can be formed adjacent to the fourth impurity diffusion area of a high concentration which functions as a source diffusion area in the direction of the depth, which is perpendicular to the surface of the semiconductor substrate. As a result, withstanding voltage of the semiconductor device can be increased while the area occupied by the semiconductor device is prevented from increasing in the direction parallel to the surface of the semiconductor substrate.

In addition, a conductive material film is formed over the entire surface so that the first and second trenches are filled in with the conductive material film in the first and second conductive films forming step, and after that, the conductive material film is divided at a point above a portion in the first area in the direction of the depth, so that first and second conductive films are formed. Therefore, unlike in the conventional configuration, it is not necessary to carry out a patterning process on an electrode having a step, that is to say, an electrode formed in a direction that is not parallel to the surface of the semiconductor substrate, and thus, it is possible to implement a semiconductor device having a high withstand voltage in a simple process.

In addition to the above described first characteristics, the manufacturing method for the semiconductor device according to the technology described herein is secondly characterized in that the fourth impurity diffusion area forming step includes implanting impurity ions of the first conductivity type in a high concentration over an entire surface so that the first and second conductive films are doped to become the first conductivity type.

In accordance with the manufacturing method for a semiconductor device according to the above described second characteristics of the technology described herein, a fourth impurity diffusion area for forming a source diffusion area is formed, and at the same time, impurity ions can be implanted into the first and second conductive films. As a result, resistance of the first and second conductive films can be reduced without increasing the number of steps.

In addition to the above described first or second characteristics, the manufacturing method for a semiconductor device according to the technology described herein is thirdly characterized in that the third insulating film forming step includes oxidizing an entire exposed surface of the semiconductor substrate, and removing an insulating film formed at the bottom of the first trench is provided after the third insulating film forming step and before the first and second conductive films forming step.

In addition to any of the above described first to third characteristics, the manufacturing method for a semiconductor device according to the technology described herein is fourthly characterized by further comprising forming a silicide layer at least on the fourth impurity diffusion area and on the first and second conductive films by forming a high melting point metal film over an entire surface and carrying out heat treatment to the high melting point metal film after the fourth impurity diffusion area forming step and before the interlayer insulating film forming step.

In accordance with the manufacturing method for a semiconductor device according to the above described fourth characteristics of the technology described herein, resistance of the contact between each of the contact plugs and the first conductive film, and the second conductive film, and the fourth impurity diffusion area respectively can be reduced.

In addition to any of the above described first to fourth characteristics, the manufacturing method for a semiconductor device according to the technology described herein is fifthly characterized in that the third impurity diffusion area exposing step includes forming respective side wall insulating films on outer walls of the first and second conductive films exposed above the surface of the semiconductor substrate and removing the third insulating film formed within an area sandwiched between the respective side wall insulating films, by forming an insulating film over an entire surface and carrying out an etch-back process on the insulating film.

In accordance with the manufacturing method for a semiconductor device according to the above described fifth characteristics of the technology described herein, certain distance can be secured between the fourth impurity diffusion area formed in the fourth impurity diffusion area forming step and the first and second conductive films without increasing the number of steps.

In addition to any of the above described first to fifth characteristics, the manufacturing method for a semiconductor device according to the technology described herein is sixthly characterized in that the second impurity diffusion area forming step includes forming a well area by implanting ions of the second conductivity type in a low concentration into a predetermined area including at least the first area.

In addition to any of the above described first to sixth characteristics, the manufacturing method for a semiconductor device according to the technology described herein is seventhly characterized in that the first and second insulating films forming step includes forming an element isolation insulating film outside an area where the first and second insulating films are formed on the semiconductor substrate at the same time as formation of the first and second insulating films.

In accordance with the manufacturing method for a semiconductor device according to the above described seventh characteristics of the technology described herein, the first and second insulating films can be formed at the same time as the step of forming an element isolation insulating film in a periphery portion through a conventional step for forming an element isolation insulating film, for example an STI method, and therefore, consistency with manufacturing processes for other peripheral circuits can be improved.

In addition to any of the above described first to seventh characteristics, the manufacturing method for a semiconductor device according to the technology described herein is eighthly characterized in that the conductive material film formed in the first and second conductive films forming step is a polysilicon film.

In the configuration of the technology described herein, a semiconductor device, specifically a MOS transistor in which a high withstand voltage can be maintained while any increase in the scale of the device is suppressed to the minimum, and which can be easily manufactured in a realistic manufacturing process can be implemented.

BRIEF DESCRIPTION OF THE DRAWINGS

FIGS. 3A to 3E are schematic cross sectional diagrams showing the structure in each step in a manufacturing method for a semiconductor device according to the technology described herein;

DESCRIPTION OF THE PREFERRED EMBODIMENTS

In the following, a semiconductor device of the technology described herein (hereinafter referred to as "the device of the technology described herein") and its manufacturing method (hereinafter referred to as "the method of the technology described herein") according to an embodiment of the technology described herein are described in reference to FIGS. 1A to 6.

Figure 4:
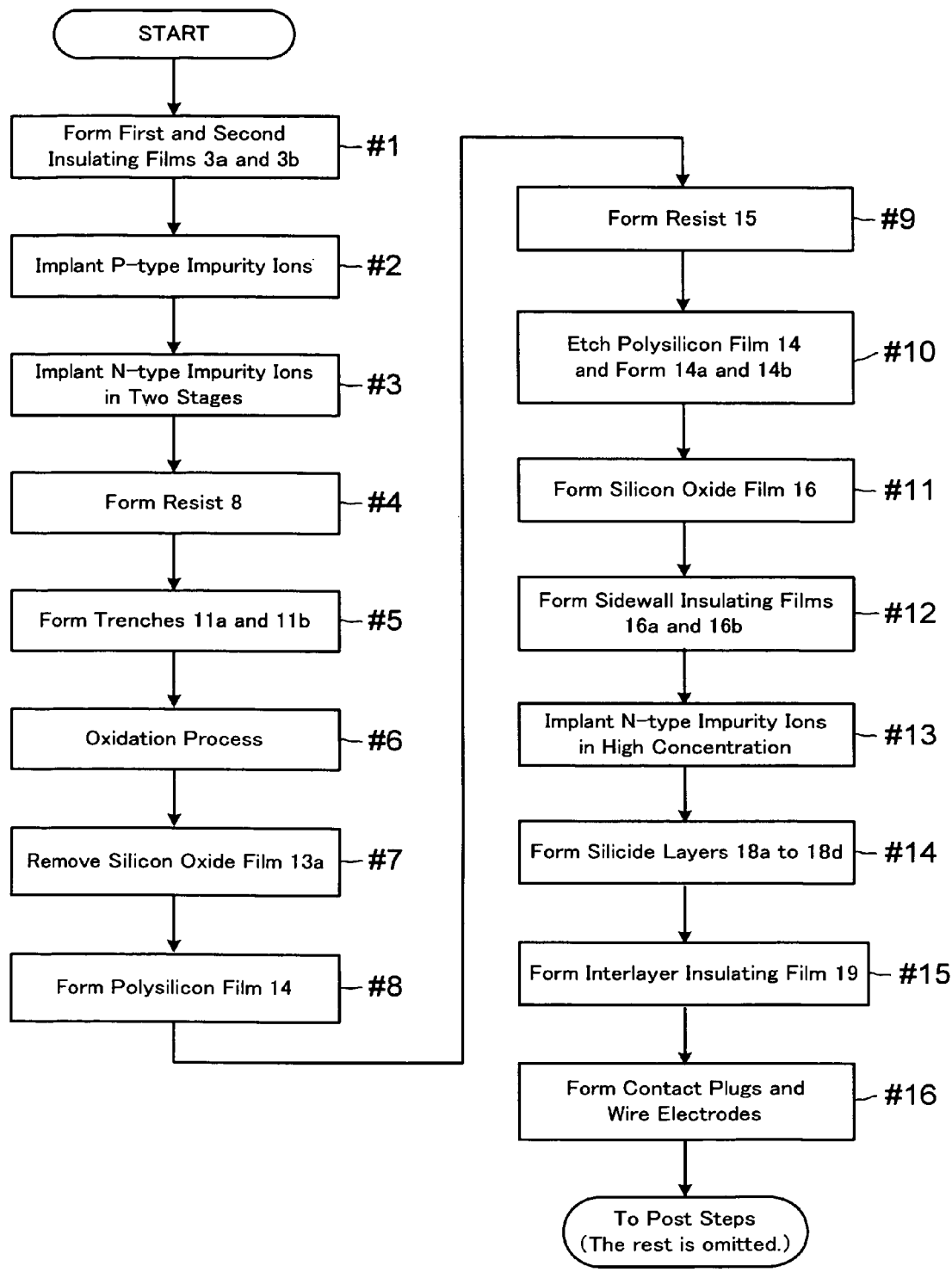
FIG. 4 is a flow chart showing manufacturing steps in a manufacturing method for a variable resistance element according to the technology described herein.

FIGS. 1A to 3E are schematic cross sectional diagrams in respective steps for manufacturing a semiconductor device according to the present embodiment (the diagrams span over three sheets due to the paper size). In addition, FIG. 4 is a flow chart for the manufacturing steps according to the present embodiment, and the respective steps #1 to #16 below represent the respective steps in the flow chart of FIG. 4.

Here, the respective schematic cross sectional diagrams in FIGS. 1A to 3E and FIGS. 5A to 6 schematically show the structure, and the dimensional ratio in the drawings do not necessarily match that of the actual product. In addition, numeral values for a film thickness described in each step are merely examples, and the invention is not limited to these values.

In addition, though a case where the device of the technology described herein includes an N-channel MOS transistor element is described below, it is possible for the device of the technology described herein to be a device including a P-channel MOS transistor element by being manufactured in accordance with the same method and with different types of impurities.

Figure 1A:
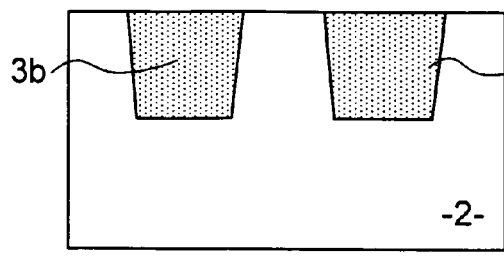
FIGS. 1A to 1F are schematic cross sectional diagrams showing the structure in each step in a manufacturing method for a semiconductor device according to the technology described herein.

First, as shown in FIG. 1A, a first insulating film 3a and a second insulating film 3b having a depth of approximately 500 nm to 1500 nm are formed on a P-type semiconductor substrate 2 so as to be away from each other using a well-known STI (shallow trench isolation) technology (Step #1). Here, in the case where ions are implanted into a predetermined area of the semiconductor substrate 2, the area where the ions have been implanted is referred to as a different name and symbol in order to be distinguished from the area where no ions have been implanted in the following, and in the case where these areas are not distinguished, they are referred to as "semiconductor substrate 2", which is a general name, as long as no confusion is caused.

Figure 1B:
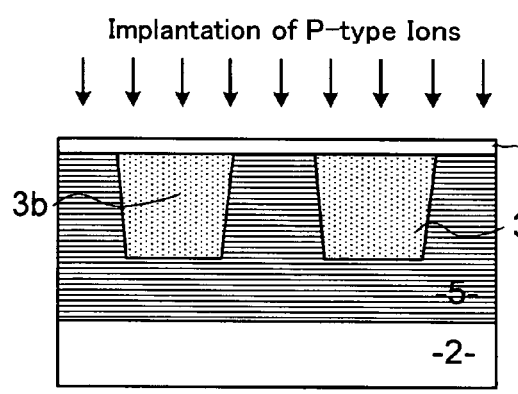

Next, as shown in FIG. 1B, a through oxide film 4 for impurity ion implantation having a film thickness of 10 nm to 30 nm is formed, and after that, P-type impurity ions (for example, B ions) are implanted and heat treatment is carried out so that a well area 5 is formed (Step #2).

Figure 1C:
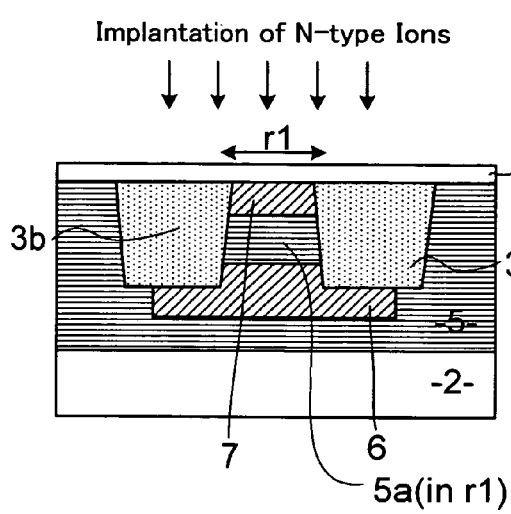

Next, as shown in FIG. 1C, low concentration N-type impurity ions (for example, P ions) are implanted in two stages followed by heat treatment so that a low concentration impurity diffusion area 7 and a low concentration impurity diffusion area 6 are formed in predetermined areas, respectively, within the well area 5 (Step #3). Here, as an example of the conditions for ion implantation, the low concentration impurity diffusion area 7 is formed with an implantation energy of approximately 50 keV to 200 keV, and the low concentration impurity diffusion area 6 is formed with an implantation energy of approximately 0.8 MeV to 1.2 MeV. After that, the through oxide film 4 is removed.

In Step #3, the low concentration impurity diffusion area 6, the well area 5 and the low concentration impurity diffusion area 7 are formed in sequence from a point deeper than the bottom of the first insulating film 3a towards the upper surface of the semiconductor substrate within the area sandwiched between the first insulating film 3a and the second insulating film 3b (hereinafter referred to as "first area r1," see FIG. 1C) on the semiconductor substrate 2. In the following, the respective diffusion areas within the first area r1 are referred to as "a first impurity diffusion area 6," "a second impurity diffusion area 5a" and "a third impurity diffusion area 7." Here, the second impurity diffusion area 5a corresponds to the area formed within the first area r1 in the well area 5.

Figure 1D:
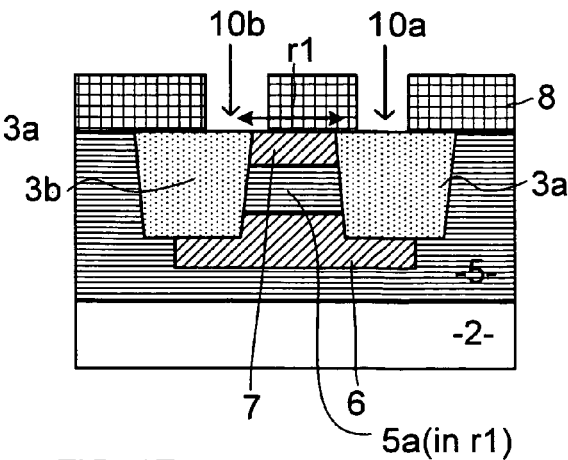

Next, as shown in FIG. 1D, a resist 8 having openings in predetermined areas above the first insulating film 3a and the second insulating film 3b is formed using a well-known photolithographic technology (Step #4). Here, the resist 8 is formed so as not to cover a part of the surface of the substrate on the second insulating film 3b side on the upper surface of the semiconductor substrate 2 sandwiched between the first insulating film 3a and the second insulating film 3b. That is to say, in FIG. 1D, the resist 8 is provided with openings 10a and 10b, the opening 10a being created by opening only above a part of the first insulating film 3a, and the opening 10b being created by opening above a part of the second insulating film 3b and a part of the third impurity diffusion area 7. In other words, in the present Step #4, a part of the first insulating film 3a is exposed from the bottom of the opening 10a, and a part of the second insulating film 3b and a part of the third impurity diffusion area 7 are exposed from the bottom of the opening 10b.

Figure 1E:
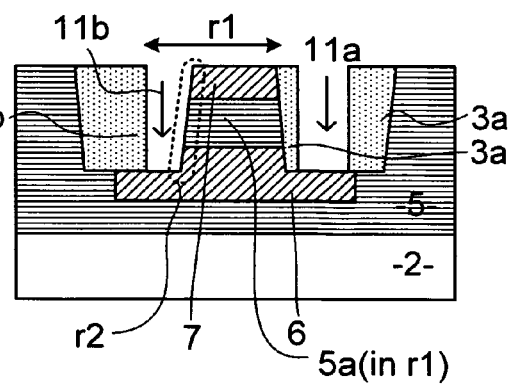

Next, as shown in FIG. 1E, the two insulating films 3a and 3b within the area which is not masked by the resist 8 are etched using a well-known dry etching technology so as to provide openings which penetrate through the two insulating films 3a and 3b, thereby creating a first trench 11a and a second trench 11b (Step #5). After that, the resist 8 is removed.

At this time, a part of the third impurity diffusion area 7 is exposed from the opening 10b in Step #4 as described above. Therefore, in the present Step #5, a part of the second insulating film 3b and an area r2 which is a part of the semiconductor substrate 2 within the first area r1 are exposed in the inner wall of the second trench 11b. In other words, the inner wall of the second trench 11b is formed of the second insulating film 3b and the semiconductor substrate 2 (in detail, the first impurity diffusion area 6, the second impurity diffusion area 5a and the third impurity diffusion area 7 in this order from the bottom towards the upper surface).

Meanwhile, only the first insulating film 3a is exposed from the opening 10a in Step #4, and the semiconductor substrate 2 is not exposed. Accordingly, in the trench 11a created in the present Step #5, its inner wall is covered only by the first insulating film 3a.

That is to say, in the present Step #5, the semiconductor substrate 2 is exposed from the bottom of the first trench 11a as well as the bottom and a part of the inner surface of the second trench 11b. In addition, the semiconductor substrate 2 (corresponding to the well area 5) is exposed from the portions which are not covered by either the insulating film 3a or 3b in the areas other than the area sandwiched between the two insulating films 3a and 3b (areas on the semiconductor substrate other than the first area r1).

Figure 1F:
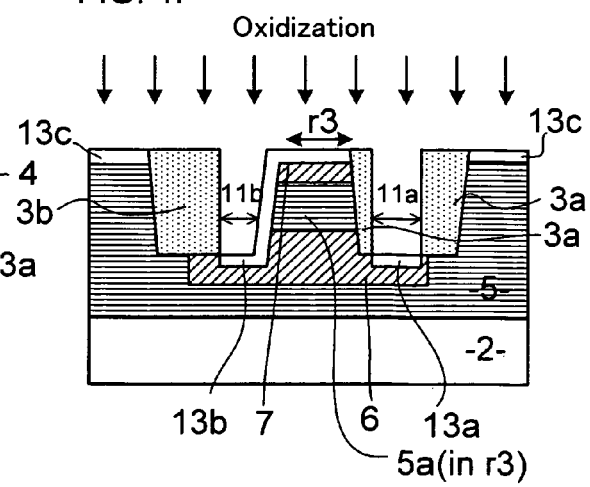

Next, as shown in FIG. 1F, the exposed semiconductor substrate 2 is oxidized in an oxygen atmosphere under the temperature conditions of approximately 850° C. to 950° C., thereby forming a silicon oxide film having a film thickness of approximately 20 nm to 50 nm (Step #6). That is to say, in the present Step #6, a silicon oxide film 13a is formed at the bottom of the trench 11a. In addition, a silicon oxide film 13b (hereinafter referred to as "a third insulating film 13b") is formed so as to extend along the active area of the semiconductor substrate 2 exposed within the first area r1, that is to say, the area from the bottom of the trench 11b to the upper surface of the semiconductor substrate 2 within the first area r1 via the area formed of the semiconductor substrate 2 within the inner wall of the trench 11b (a multilayer structure made up of the exposed first impurity diffusion area 6, the second impurity diffusion area 5a and the third impurity diffusion area 7). Furthermore, a silicon oxide film 13c is formed on the upper surface of the semiconductor substrate 2 within areas which are not sandwiched between the two insulating films 3a and 3b.

Here, in the following, the area sandwiched between the third insulating film 13b and the second insulating film 3a is referred to as "area r3." At this time, the first impurity diffusion area 6, the second impurity diffusion area 5a and the third impurity diffusion area 7 are formed in sequence from the bottom towards the upper surface within the area r3.

Figure 2A:
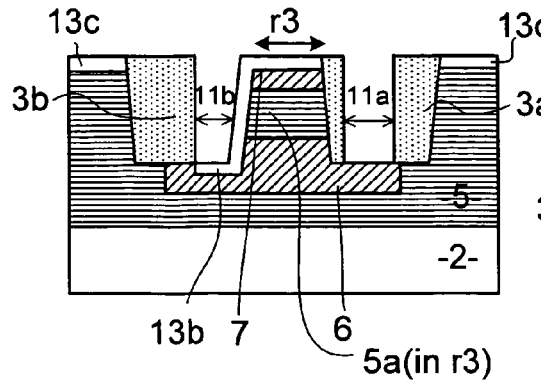
FIGS. 2A to 2E are schematic cross sectional diagrams showing the structure in each step in a manufacturing method for a semiconductor device according to the technology described herein.

Next, as shown in FIG. 2A, among the silicon oxide films formed in Step #6, the silicon oxide film 13a formed at the bottom of the first trench 11a is removed through etching (Step #7).

Figure 2D:
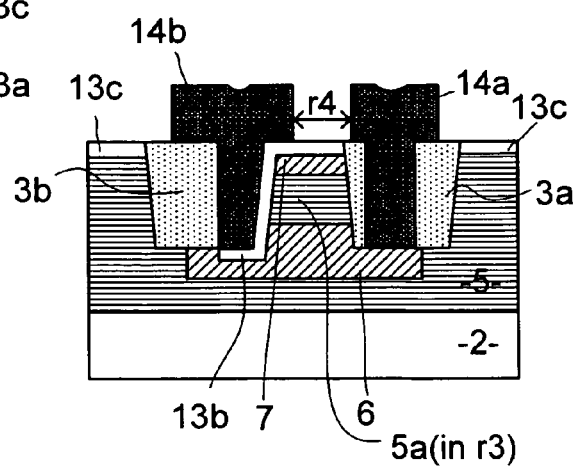
Figure 2B:
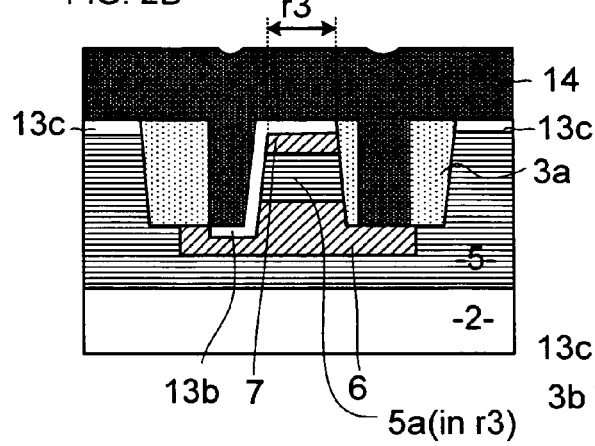

Next, as shown in FIG. 2B, a conductive material film 14 having a film thickness of approximately 100 nm to 400 nm is formed on the entire surface in accordance with a CVD (chemical vapor deposition) method (Step #8). At this time, the film thickness of the conductive material film 14 is adapted to be approximately ½ or greater than the diameter of the two trenches 11a and 11b, and thus, the flatness on the surface of the formed conductive material film 14 can be increased. Here, as the conductive material film formed in the present step, a polysilicon film can be used, for example.

Here, in the present Step #8, the first trench 11a and the second trench 11b are filled in, and as a result, the trenches disappear. Therefore, in the case where "a first trench 11a" and "a second trench 11b" are described in Step #9 or later, they indicate the first trench 11a and the second trench 11b created before they are filled in with the conductive material film 14.

Figure 2E:
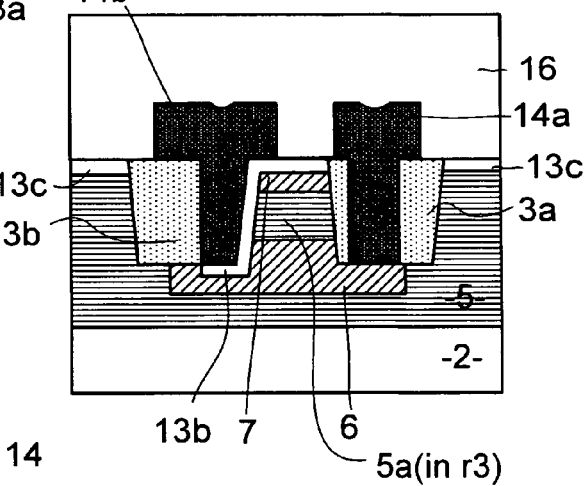
Figure 2C:
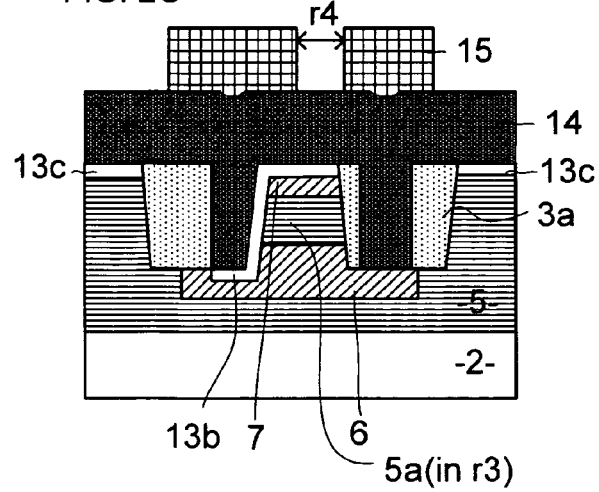

Next, as shown in FIG. 2C, a resist 15 having openings in predetermined areas above the polysilicon film 14 is formed using a well-known photolithographic technology (Step #9). Here, the resist 15 is formed so as to cover at least the portions above the first trench 11a and the second trench 11b (see FIG. 2A) and not cover a portion above the area sandwiched between these trenches 11a and 11b (area r4).

Next, as shown in FIG. 2D, the conductive material film 14 within the areas which are not masked by the resist 15 is etched in the direction perpendicular to the surface of the semiconductor substrate 2 (hereinafter referred to as "direction of depth") using a well-known dry etching technology (Step #10). In the present Step #10, the conductive material film 14 is divided into the first conductive film 14a for filling in the first trench 11a and the second conductive film for filling in the trench 11b. After that, the resist 15 is removed.

Next, as shown in FIG. 2E, an insulating film 16 having a film thickness of approximately 100 nm to 300 nm is formed on the entire surface in accordance with a CVD method (Step #11). Here, a silicon oxide film is adopted as the insulating film 16, and in the following, referred to as "silicon oxide film 16."

Next, as shown in FIG. 3A, etch back is carried out on the entire surface of the silicon oxide film 16, thereby forming a sidewall insulating film 16a and a sidewall 16b on an outer wall of the first conductive film 14a and an outer wall of the second conductive film 14b, respectively (Step #12). Here, in the present Step #12, the silicon oxide film 16 and the third insulating film 13b within the area sandwiched by the two sidewall insulating films 16a and 16b are completely removed, thereby exposing the semiconductor substrate 2 (third impurity diffusion area 7) within this area. In addition, in the present Step #11, the silicon oxide film 16 formed within the areas which are not sandwiched by the two insulating films 3a and 3b is also completely removed, thereby exposing the semiconductor substrate 2 (well area 5).

Next, as shown in FIG. 3B, high concentration N-type impurity ions for forming source/drain diffusion areas (for example, P ions or As ions) are implanted and heat treatment is carried out for approximately 10 minutes to 30 minutes under the temperature conditions of approximately 800° C. to 900° C. (Step #13). In the present Step #13, a high concentration impurity diffusion area 17a is formed within an area which is not sandwiched by the two insulating films 3a and 3b, and a high concentration impurity diffusion area 17b (hereinafter referred to as "fourth impurity diffusion area 17b") is formed on the upper surface of the third impurity diffusion area 7 which is exposed within the area r3 sandwiched between the third insulating film 13b and the second insulating film 3a. In addition, the N-type impurity ions are also implanted into the two conductive films 14a and 14b.

Next, as shown in FIG. 3C, silicide layers 18a and 18b are formed on the upper surface of the first conductive film 14a and the second conductive film 14b, respectively, and silicide layers 18c and 18d are formed on the upper surface of the high concentration impurity diffusion area 17a and the fourth impurity diffusion area 17b, respectively (Step #14). Concretely, a film of a high melting point metal (Co, Ti or the like) having a thickness of approximately 10 nm to 30 nm is formed on the entire surface in accordance with a sputtering method, and after that, an RTA (rapid thermal annealing) process is carried out under the temperature conditions of approximately 450° C. to 550° C. so that the film is converted to silicide, and after that, the film of the high melting point metal which has not reacted is removed, and then, an RTA process is again carried out under the temperature conditions of approximately 600° C. to 850° C.

Next, as shown in FIG. 3D, an interlayer insulating film 19 having a film thickness of approximately 1000 nm to 1500 nm is formed on the entire surface in accordance with a CVD method, and after that, the surface is flattened in accordance with a well-known CMP (chemical mechanical polishing) method (Step #15).

Next, as shown in FIG. 3E, contact plugs 21a, 21b and 21d are formed using a well-known technology so as to make electrical contact with the silicide layers 18a, 18b and 18d, respectively, and after that, wire electrodes 22a, 22b and 22d are formed so as to make electrical contact with these contact plugs 21a, 21b and 21d, respectively (Step #16).

Concretely, first, an opening is created in the interlayer insulating film 19 above a part of each of the silicide layers 18a, 18b and 18d using a well-known photolithographic technology and etching technology, and after that, a contact material film made of a high melting point metal (W or the like) is filled in so that the respective openings are completely filled and etch back is carried out until the upper surface of the interlayer insulating film 19 is exposed, thereby forming the contact plugs 21a, 21b and 21d. After that, a predetermined electrode material film having a film thickness of approximately 400 nm to 1000 nm (AlSl or AlCu or a multilayer film of one of these and a high melting point metal (Ti or TiN)) is formed in accordance with a sputtering method, and after that, a patterning process for a predetermined pattern is carried out, thereby forming the wire electrodes 22a, 22b and 22d.

Figure 5A:
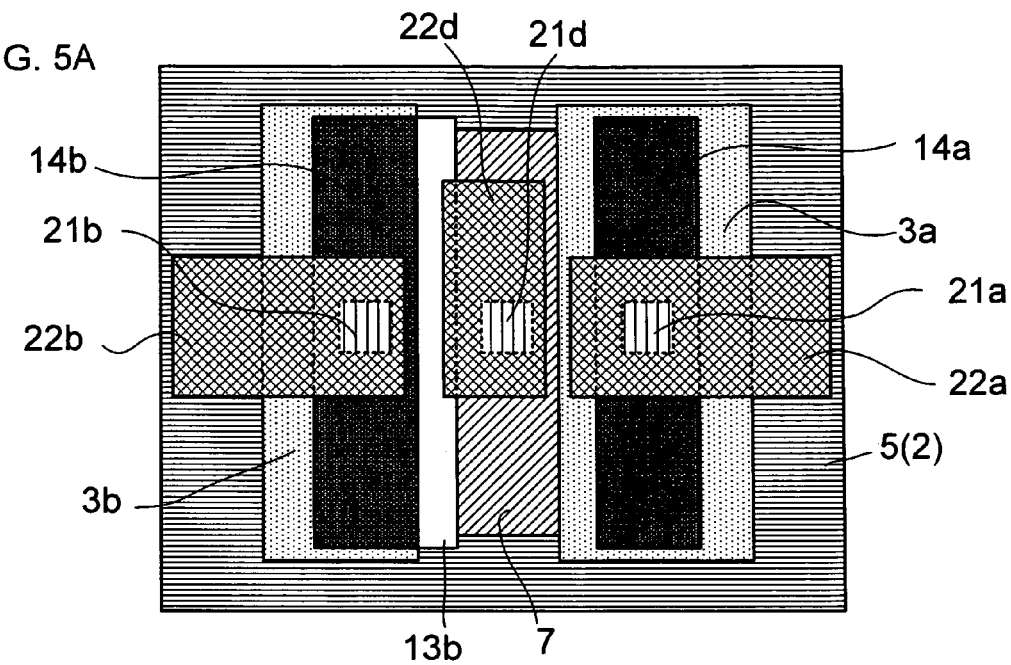
FIGS. 5A and 5B are schematic diagrams showing the structure of a semiconductor device according to the technology described herein.
Figure 5B:
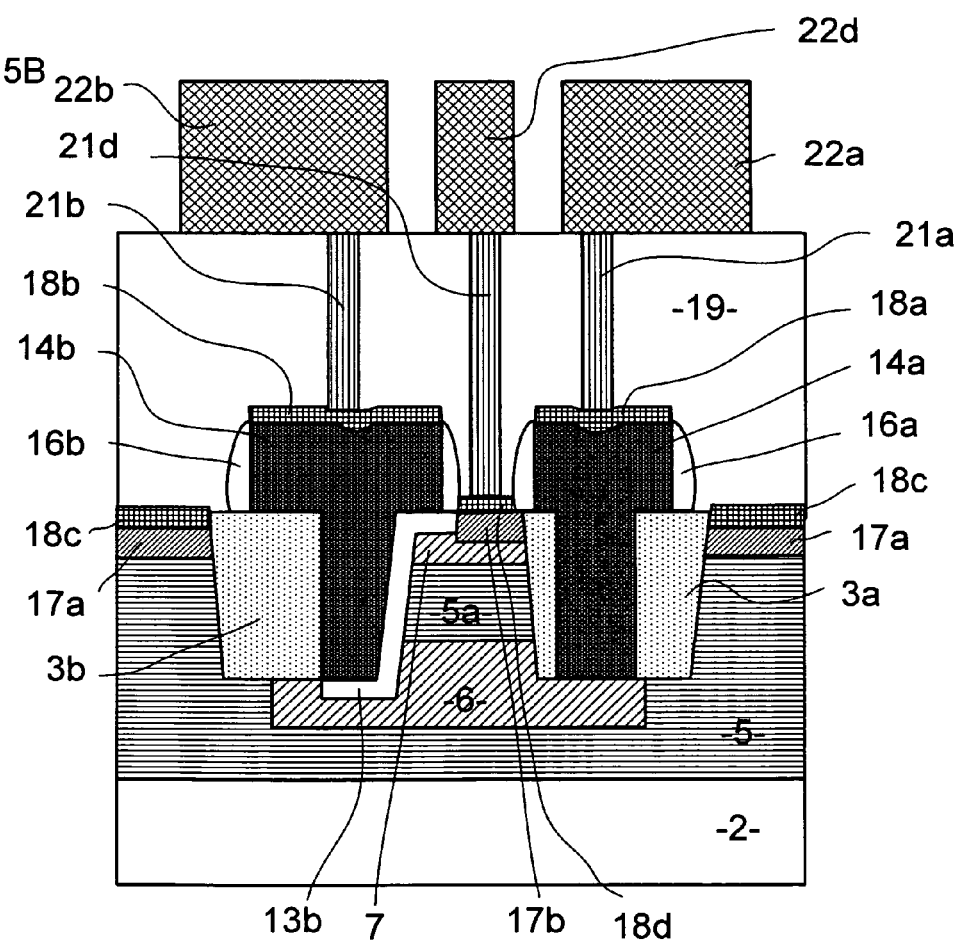
Figure 6:
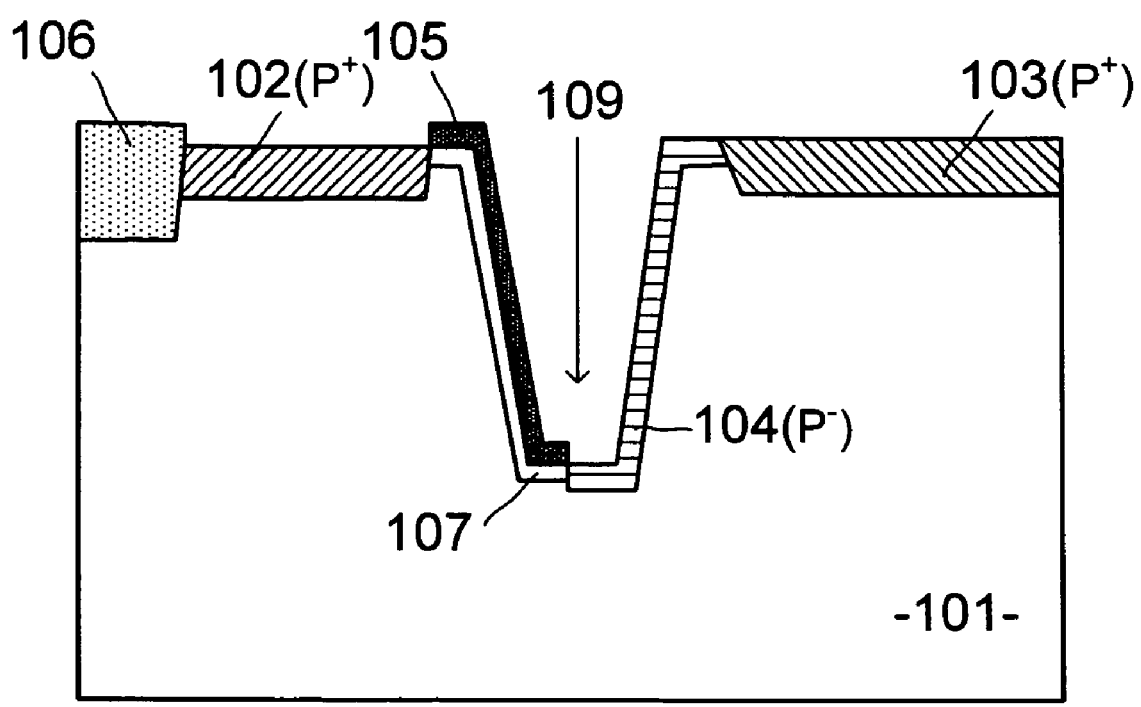
FIG. 6 is a schematic cross sectional diagram showing the structure of a conventional high voltage transistor element.

FIG. 5A is a schematic plan diagram and FIG. 5B is a schematic cross sectional diagram, both showing the structure of the device of the technology described herein formed through the above described Steps #1 to #16. Here, FIG. 5B is a diagram showing the same structure as FIG. 3E, and in FIG. 5A, some components are omitted for the sake of description.

As shown in FIGS. 5A and 5B, the fourth impurity diffusion area 17b is formed within the area sandwiched between the third insulating film 13b and the first insulating film 3a on the semiconductor substrate 2. In addition, the third impurity diffusion area 7, which is of the same N-type, is formed so as to make contact with this fourth impurity diffusion area 17b. Furthermore, the second impurity diffusion area 5a is formed beneath this third impurity diffusion area 7. In addition, the first impurity diffusion area 6 is formed in an area which includes portions directly beneath the two insulating films 3a and 3b and a portion beneath the second impurity diffusion area 5a. Furthermore, the first conductive film 14a is formed so as to penetrate through the first insulating film 3a and make contact with this first impurity diffusion area 6.

In addition, the second conductive film 14b formed so as to penetrate through the second insulating film 3b is isolated from the active area (7, 5a, 6) by the third insulating film 13b.

The third impurity diffusion area 7 and the first impurity diffusion area 6 are both N-type impurity diffusion areas, and in the area sandwiched by these two diffusion areas, the second impurity diffusion area 5a, which is a P-type impurity diffusion area, is formed. In addition, the second conductive film 14b is formed so as to face this second impurity diffusion area 5a across the third insulating film 13b.

That is to say, in the device of the technology described herein, a MOS transistor having the second conductive film 14b which functions as a gate electrode, the third insulating film 13b which functions as a gate oxide film, the fourth impurity diffusion area 17b and the third impurity diffusion area 7 which function as a source diffusion area, and the first impurity diffusion area 6 which functions as a drain diffusion area can be implemented. In addition, the silicide layer 18d which is electrically connected to the fourth impurity diffusion area 17b functions as a source electrode, and the first conductive film 14a and the silicide layer 18a which are electrically connected to the first impurity diffusion area 6 function as a drain electrode.

In the case of the device of the technology described herein, though the first impurity diffusion area 6 and the third impurity diffusion area 7 become areas of which the concentration is lower than the fourth impurity diffusion area 17b, the first impurity diffusion area 6 can function better as an electrical field buffering area in that the width and the depth of the area can be sufficiently secured. Accordingly, a MOS transistor having the first impurity diffusion area 6 as a drain diffusion area which performs an electrical field buffering function and the third impurity diffusion area 7 as a source diffusion area can be implemented. That is to say, in the device of the technology described herein, as shown in FIG. 5B, the top and the bottom are configured to be asymmetrical, and therefore, the drain diffusion area and the source diffusion area cannot be switched in the structure.

In the structure of the device of the technology described herein, the conditions for the ion implanting process in Step #3 can be appropriately changed so that the width, depth and concentration of the first impurity diffusion area 6, which is an electrical field buffering area, can be freely selected, and thus, the freedom at the time of manufacture is increased. In other words, a MOS transistor can be freely implemented in accordance with the restrictions and conditions in terms of the withstand voltage and dimensions.

In the device of the technology described herein, the impurity diffusion areas 6 and 7 of a low concentration which function as electrical field buffering areas are arranged in the direction perpendicular to the surface of the semiconductor substrate 2 (direction of the depth), and at the same time, the fourth impurity diffusion area 17b of a high concentration is formed so as to make contact with the first impurity diffusion area 7. As a result, the fourth impurity diffusion area 17b and the third impurity diffusion area 7 as well as the first impurity diffusion area 6 form a source and drain pair, and at the same time, the first and third impurity diffusion areas are formed of low concentration areas so that an electrical field buffering function can be gained. In addition, the second conductive film 14b, which functions as a gate electrode, is formed in the direction of the depth of the substrate 2, so as to face this source and drain pair and the second impurity diffusion area 5a formed therebetween across the third insulating film 13b which functions as a gate oxide film, and thus, an increase of the area occupied by the device can be prevented in the direction parallel to the substrate 2.

In addition, as shown in FIG. 2D and in Step #10, the second conductive film 14b for forming the gate electrode can be formed by carrying out an etching process in the direction perpendicular to the surface of the semiconductor substrate 2. Accordingly, unlike the description in well-known Document 1, it is not necessary to carry out a patterning process on an electrode having a step, that is to say, an electrode which is formed in the direction not parallel to the surface of the semiconductor substrate 2, and therefore, the device can be implemented in a simple process. Furthermore, when contacts are connected to the respective electrodes, as shown in FIG. 3E, contact plugs may be formed in accordance with a conventional contact plug forming process so as to make contact with the silicide layers formed parallel to the surface of the semiconductor substrate 2, and therefore, unlike the description of well-known Document 1, it is not necessary to connect a contact to an electrode formed in the direction not parallel to the surface of the semiconductor substrate 2. As a result, a semiconductor device, including a high voltage transistor, can be implemented only in a simple process.

Furthermore, in the device of the technology described herein, the channel area (second impurity diffusion area 5a) is formed in an area sandwiched between the two insulating films 3a and 3b formed in the same process as the element isolation insulating film. Therefore, high electrical field buffering effects can be gained at the edge of the channel area in comparison with the configuration in well-known Document 1 where the channel area is formed in a location lower than the element isolation insulating film, and thus, a transistor having excellent performance in terms of withstand voltage can be implemented.

In addition, high concentration impurity ions are implanted into the two conductive films 14a and 14b in addition to the semiconductor substrate 2 in the high concentration impurity ion implanting process in Step #13 (see FIG. 3B). As a result, resistance of the two conductive films 14a and 14b can be reduced at the same time as the formation of the fourth impurity diffusion area 17b. Furthermore, silicide layers are formed on the upper surface of the two conductive films 14a and 14b as well as the fourth impurity diffusion area 17b, and thus, the resistance of the contact can be reduced.

In the following, other embodiments are described.

(1) Though in the above described embodiment, the conductive material film (material film to be a gate electrode material) formed in Step #8 is a polysilicon film 14, the material film formed in this step is not limited to a polysilicon film, as long as the material film can be used as a gate electrode film.

(2) Though in the above described embodiment, the impurity diffusion areas 6 and 7 formed in Step #3 are both low concentration impurity diffusion areas, electrical field buffering effects can be gained as long as at least the impurity diffusion area 7 is of a low concentration. In order to attain excellent performance in terms of the withstand voltage, however, it is preferable for the two diffusion areas to be impurity diffusion areas of a low concentration, as in the above described embodiment.

(3) Though in the above described embodiment, the first impurity diffusion area 6 is formed in an area which includes portions directly beneath the two insulating films 3a and 3b in the configuration (see FIG. 5B), it may be formed in an area which includes at least a portion directly beneath the first insulating film 3a and a portion directly beneath the third insulating film 13b. In other words, in the step of forming a trench area in Step #5, the first impurity diffusion area 6 may be formed directly beneath the second trench 11b instead of directly beneath the remaining second insulating film 3b.

(4) Though in the above described embodiment, the channel area (second impurity diffusion area 5a) sandwiched between the third impurity diffusion area 7 and the first impurity diffusion area 6 is attained using a well area 5, it is also possible to form the channel area using the conductivity type of the semiconductor substrate. That is to say, in the case where the semiconductor substrate 2 is a P-type substrate and a channel area is attained using the conductivity type of this substrate, the step for implanting a well in Step #2 becomes unnecessary.

Although the technology described herein has been described in terms of the preferred embodiment, it will be appreciated that various modifications and alternations might be made by those skilled in the art without departing from the spirit and scope of the invention. The invention should therefore be measured in terms of the claims which follow.

What is claimed is:

1. A method for manufacturing a semiconductor device:
   a first insulating film;
   a second insulating film
   a third insulating film;
   a first conductive film;
   a second conductive film;
   a first impurity diffusion area of a first conductivity type;
   a second impurity diffusion area of a second conductivity type which is different from the first conductivity type;
   a third impurity diffusion area of the first conductivity type;
   a fourth impurity diffusion area of the first conductivity type of which concentration is higher than in the third impurity diffusion area;
   an interlayer insulating film; and
   contact plugs, the method comprising:
   forming the first insulating film and the second insulating film downward from a surface of a semiconductor substrate so that the first and second insulating films are at a distance from each other in a direction parallel to the surface of the semiconductor substrate;
   forming the second impurity diffusion area in a first area sandwiched between at least the first and second insulating films after forming the first and second insulating films;
   forming the first impurity diffusion area and the third impurity diffusion area, respectively, by implanting low concentration ions of the first conductivity type a plurality of times with different conditions for implantation after forming the second impurity diffusion area, the first impurity diffusion area being formed from a point which is deeper than bottoms of the first and second insulating films to a point which is shallower than the bottoms but deeper than an upper surface of the semiconductor substrate so as to make contact with at least the bottoms of the first and second insulating films and portions of outer walls of the first and second insulating films facing each other within the first area, the third impurity diffusion area being formed so as to face the first impurity diffusion area across the second impurity diffusion area and make contact with portions of the outer walls of the first and second insulating films facing each other within the first area;
   forming a first trench and a second trench, respectively, by carrying out an etching process on the first and second insulating films in such a state that predetermined areas are masked after forming the first and third impurity diffusion areas, the first trench having a bottom composed of the first impurity diffusion area and an inner wall surrounded by the first insulating film, the second trench having a bottom composed of the first impurity diffusion area and an inner wall of which a portion is made of the second insulating film and the remaining portion is made of a multilayer structure of the first impurity diffusion area, the second impurity diffusion area and the third impurity diffusion area;
   forming the third insulating film by carrying out an oxidation process after forming the first and second trenches, the third insulating film extending from at least the bottom of the second trench to the upper surface of the semiconductor substrate within the first area via the multilayer structure which forms a part of the inner wall of the second trench;
   forming the first conductive film for filling in the first trench and the second conductive film for filling in the second trench by forming a conductive material film over an entire surface so that the first and second trenches are completely filled after forming the third insulating film, and by dividing the conductive material film at a point above an area sandwiched between the first and second trenches;
   exposing the third impurity diffusion area by removing the third insulating film formed within an area sandwiched between the first and second conductive films after forming the first and second conductive films;
   forming the fourth impurity diffusion area on the third impurity diffusion area by implanting impurity ions of the first conductivity type in a high concentration after exposing the third impurity diffusion area;
   forming the interlayer insulating film over an entire surface after forming the fourth impurity diffusion area; and
   forming the contact plugs for making electrical contact with the first conductive film, the second conductive film and the fourth impurity diffusion area, respectively after forming the interlayer insulating film.

2. The method for manufacturing a semiconductor device according to claim 1, wherein
forming the fourth impurity diffusion area includes implanting impurity ions of the first conductivity type in a high concentration over an entire surface so that the first and second conductive films are doped to become the first conductivity type.

3. The method for manufacturing a semiconductor device according to claim 1, wherein
forming the third insulating film includes oxidizing an entire exposed surface of the semiconductor substrate, and the method further comprising
removing an insulating film formed at the bottom of the first trench after forming the third insulating film and before the forming first and second conductive films.

4. The method for manufacturing a semiconductor device according to claim 1 further comprising
forming a silicide layer at least on the fourth impurity diffusion area and on the first and second conductive films by forming a high melting point metal film over an entire surface and carrying out heat treatment to the high melting point metal film after forming the fourth impurity diffusion area and before forming the interlayer insulating film.

5. The manufacturing method for a semiconductor device according to claim 1, wherein
exposing the third impurity diffusion area includes forming respective side wall insulating films on outer walls of the first and second conductive films exposed above the surface of the semiconductor substrate and removing the third insulating film formed within an area sandwiched between the respective side wall insulating films, by forming an insulating film over an entire surface and carrying out an etch-back process on the insulating film.

6. The method for manufacturing a semiconductor device according to claim 1, wherein
forming the second impurity diffusion area includes forming a well area by implanting ions of the second conductivity type in a low concentration into a predetermined area including at least the first area.

7. The method for manufacturing a semiconductor device according to claim 1, wherein
forming the first and second insulating films includes forming an element isolation insulating film outside an area where the first and second insulating films are formed on the semiconductor substrate at the same time as formation of the first and second insulating films.

8. The method for manufacturing a semiconductor device according to claim 2, wherein
the conductive material film formed in the first and second conductive films forming step is a polysilicon film.

* * * * *